(12) United States Patent
Johnson

(10) Patent No.: US 6,525,976 B1
(45) Date of Patent: Feb. 25, 2003

(54) SYSTEMS AND METHODS FOR REDUCING NOISE IN MIXED-MODE INTEGRATED CIRCUITS

(75) Inventor: Lonnie G. Johnson, Atlanta, GA (US)

(73) Assignee: Excellatron Solid State, LLC, Smyrna, GA (US)

( * ) Notice: Subject to any disclaimer, the term of this patent is extended or adjusted under 35 U.S.C. 154(b) by 87 days.

(21) Appl. No.: 09/695,345

(22) Filed: Oct. 24, 2000

(51) Int. Cl.[7] ................................................ G11C 7/02
(52) U.S. Cl. ....................... 365/206; 365/226; 365/227
(58) Field of Search ............................. 365/206, 154, 365/226, 227

(56) References Cited

U.S. PATENT DOCUMENTS

| | | | |
|---|---|---|---|
| 5,649,160 A | | 7/1997 | Corry et al. |
| 5,734,603 A | * | 3/1998 | Tai .............................. 365/149 |
| 5,905,399 A | | 5/1999 | Bosnyak et al. |
| 5,973,952 A | * | 10/1999 | Crafts ......................... 257/296 |
| 5,999,440 A | * | 12/1999 | Crafts ......................... 365/149 |
| 6,020,614 A | | 2/2000 | Worley |

FOREIGN PATENT DOCUMENTS

| | | |
|---|---|---|
| EP | 0586163 B1 | 10/1997 |
| JP | 10135336 | 5/1998 |

OTHER PUBLICATIONS

Substrate Noise Analysis of Mixed–Signal ICs, CadMos Design Technology, Inc., Jun. 14, 2000.
Dallas Semiconductor, DS1350W, 3.3v4096k Nonvolatile SRAM with Battery Monitor.
Texas Instruments, Ramdom Access Memories.
Hubing et al, Power Bus Noise Reduction Using Power Islands in Printed Circuit Board Designs, Univ. of Missouri–Rolla.
Boolean Algebra and Logic Gates, Chapter 2, Sec. 2–8 IC Digital Logic Families.
Liu et al, Active Substrate Coupling Noise Reduction Methods for ICs, Electronic Letters, Sep. 16, 1999, vol. 35, No. 19.
Integrated Electronics, Sec. 17–18, Dynamics MOS Circuits.
Integrated Electronics, Sec. 7, Integrated Circuits: Fabrication and Characteristics.

* cited by examiner

Primary Examiner—Richard Elms
Assistant Examiner—Hien Nguyen
(74) Attorney, Agent, or Firm—Baker, Donelson, Bearman & Caldwell

(57) ABSTRACT

Systems and methods for an integrated circuit that reduces switching noise including an inverter network having at least two transistors, a micro-battery, such as a thin film battery, coupled to the inverter network and a resistor coupled at one end to the micro-battery and connected to a power source at the other end. When the transistors transition from one logic state to another logic state, for a period of time more than one transistor is turned on. Unless controlled, this state produces a high amount of current and a resultant voltage spike. The current demanded during this transition period is drawn from the micro-battery preventing a peak voltage flowing to and disrupting the analog components. The battery re-charges gradually and thus, no voltage spike occurs. Further, integrated circuit components are isolated from the power line by the resistor that limits the current drawn on the line.

12 Claims, 4 Drawing Sheets

SYSTEMS AND METHODS FOR REDUCING NOISE IN MIXED-MODE INTEGRATED CIRCUITS

FIELD OF THE INVENTION

This invention relates generally to semiconductor integrated circuits, and more particularly, to systems and methods for reducing noise in mixed-mode semiconductor integrated circuits.

BACKGROUND OF THE INVENTION

In today's environment, semiconductors may contain both analog and digital components, commonly referred to as mixed signal or mixed-mode integrated circuits (ICs). The integration of analog and digital components on the same chip reduces costs, area and power requirements, which are important considerations in the manufacture of ICs. However, the combination of analog and digital components on the same substrate causes design challenges. Principally, switching noise from high-speed digital circuits easily interfere with and damage high-frequency analog circuits. Normally digital circuits switch quickly between predefined voltage levels, and consequently induce transient noise in power lines. Analog circuits what operate at a multiplicity of voltage levels and frequencies are sensitive to induced noise while the digital circuits are better able to withstand interference from induced noise.

Integrated circuits include a number of devices that are noise sensitive high performance devices. Fast changes in the charging or discharging of current can cause drops in voltage. This transient voltage can be large enough to interfere with the performance of these sensitive devices.

Substrate noise can affect numerous applications. For instance, substrate noise is a problem with phase-locked loop systems (PLLs) and inverters. PLLs are used in numerous applications including data recovery in disk drives, wired and wireless communications, high-speed microprocessors and memories.

Invertors (also referred to as flip-flops) are also widely used. Flip-flops serve important functions in reading and writing bits of words in memory devices. Normally, flip-flops encompass high-speed switching circuits that can be addressed to write or read into the flip-flop (need to define the flip-flop)

In a steady-state or quiescent condition, i.e. no switching occurring between output states, no current flows in the flip-flop from a power supply. Typically, the flip-flop includes a network of transistors connected to a power source and ground. In the steady-state condition, one transistor (or group of transistors) is turned on, and another transistor (or group of transistors) is turned off. To switch from one transistor to another, the power source switches from one state to another, for instance, from low to high which draws current. When one transistor is being turned off and the other transistor is being turned on, for a period of time, both transistors are on. During this period high current is present in the network. This high current causes a spike in voltage which introduces noise during the switching process. As the current is pulled through wires in the network, resistance is encountered and the voltage begins to drop and becomes a transient voltage throughout the IC. These transients can propagate along wires supplying power to the integrated circuit from the printed circuit board on which the integrated circuit board is mounted. The transients produce radio frequency (RF) radiation which can interfere with proper operation of other circuits on the printed circuit board as well as other circuits within the integrated circuit itself.

A number of prior attempts at solving switching noise problems have been proposed. One proposed solution focuses on controlling the current surge. U.S. Pat. No. 5,905,339 entitled "CMOS integrated circuit regulator for reducing power supply noise," issued May 18, 1999, involves a complementary metal-oxide-semiconductor (CMOS) regulator which provides a constant current to a set of logic gates during the switching transition. This arrangement decouples the external supply shared by analog circuits and supplies current to supply rails. This current is kept nearly constant by a clamping action of clamping transistors. Excess charge for transient currents is supplied by a capacitor, which is replenished during non-switching times.

Another attempt to solve the noise problem involves the addition of decoupling capacitors placed near active devices. The decoupling capacitors stabilize the current flowing to these devices. However, while the capacitor absorbs some of the voltage, a spike still occurs.

Still another attempt to solve substrate noise problems involves an active method utilizing linear feedback loops. This approach involves sampling the noise at the analog receiver portion of the noise and directing that noise into an input stage of a negative feedback loop. After being amplified with reverse phase, the noise is re-injected into the substrate again. The re-injected noise, which has the opposite phase to that of the original noise traveling inside the substrate, may be used to cancel up to 83% of the original noise. This solution operates on mixed-mode integrated circuits operating at lower frequencies and low power portable electronics with slower digital clock speeds.

Yet another attempt to manage switching noise involve partitioning analog and digital functions. This process requires unique manufacturing processes and custom designs. For example, U.S. Pat. No. 6,020,614 entitled "Method of Reducing Substrate Noise Coupling in Mixed Signal Integrated Circuits," issued Feb. 1, 2000, suggests that noise can be reduced by establishing boundary zones between the analog and digital circuits of a semiconductor substrate with the analog circuit having a separate power supply bus from the digital circuit. Further, this patent discloses providing interconnect signal lines such that the isolated wires between the circuits may functionally interact with other circuits while the substrate noise coupling from other circuits remains low. However, spacing the analog components from the digital components can waste precious semiconductor space, which is an important consideration in integrated circuit design.

Still another attempt to resolve switching noise problems is addressed in U.S. Pat. No. 5,649,160 entitled "Noise Reduction in Integrated Circuits and Circuit Assemblies," issued Jul. 15, 1997. This patent suggests that the noise can be reduced by shaping the noise from the digital circuit and concentrating it in a single or a small number of parts of the frequency spectrum. This solution relies on the concept that the presence of noise in the analog circuit is less important at certain frequencies, and therefore the spectral peak or peaks from the digital circuit can be carefully placed to result in little or no interference.

The various prior attempts to solve the switching noise problems each have limitations. According, a need exists for systems and method to substantially reduce switching noise in mixed-mode integrated circuits.

SUMMARY OF THE INVENTION

This invention aims to overcome the problems associated with switching noise encountered in integrated circuits having analog and digital components by inclusion of a micro-battery on the integrated circuit. Noise arises in integrated circuits through several environments. Notably, noise is encountered when certain integrated circuits, such as inverters, transition from one logic state to another logic state. For example, inverter A must be turned on and inverter B must be turned off During the transition, for a period of time when both inverters are on while the transition completes. In this instance, a high current exists resulting in a spike in voltage and the introduction of noise.

An integrated circuit consistent with this invention that reduces switching noise includes an inverter network having at least two transistors, a gating network coupled to the inverter network, a micro-battery coupled to the inverter and a resistor coupled at one end to the micro-battery and connected to a power source at the other end. At steady state, the micro-battery is uncharged. When charged, nominal current flows through the micro-battery. When the inverter transitions, and the current surge occurs causing the resultant voltage spike, the current demand to reduce the voltage is drawn from the micro-battery. Thus, the integrated circuit avoids have a peak voltage flowing to and disrupting the analog components. In addition, the battery recharges gradually so no voltage spike occurs. Further, components of the integrated circuit are isolated from the power line, i.e. $V_{DD}$, by the resistor that limits the current drawn on the line. Alternatively, the inverter can encompass a bipolar RAM storage cell including two crosscoupled three-emitter transistors.

In another embodiment of this invention, switching noise is reduced in a non-switched integrated circuit. This embodiment includes a plurality of transistors with one group of transistors in an on logic state and another group of transistors in an off logic state. A micro-battery couples to each group of transistors. Knowledge of status of transistors is determined by whether the associated micro-battery is charged or uncharged. To write to the cell, the associated micro-battery is charged, turning on the accompanying transistor.

Another alternative embodiment of this invention to reduce switching noise encompasses a random access memory network having a micro-battery and resistor for reducing switching noise. The random access memory network includes a plurality cells. The cells encompass an inverter circuit. The addition of the micro-battery provides for the capacitor 130 charging from the micro-battery. Thus the capacitor is able to handle current surges resulting in the voltage spike to the power line. The resistor serves to further limit the current draw on the voltage line.

Yet another alternative embodiment of this invention includes a random access memory network with a micro-battery and resistor circuit associated with each cell of the network where each micro-battery and resistor circuit operates independently. A localized micro-battery source for each cell increases the speed of the network while reducing switching noise and resistor size.

This invention accordingly aims to achieve at least one, more or combinations of the following objectives:

To provide systems and methods for reducing switching noise of a mixed-mode integrated circuit such that components of an integrated circuit are not damaged by transient noise.

To provide systems and methods for reducing switching noise of an integrated circuit utilizing a micro-battery to supply current to the integrated circuit upon an increase in current demands during period of transition from one logic state to another logic.

To provide systems and methods for use of a micro-battery in integrated circuits to indicate whether associated transistors are turned off or turned on.

To provide systems and methods for reducing switching noise in integrated circuits utilizing a micro-battery that efficiently uses semiconductor space.

To provide systems and methods that isolate power lines from voltage spikes.

Other objects, advantages and features of the systems and methods of this invention will be set forth in part in the description which follows and in part will be obvious from the description or may be learned by practice of the invention. The objects, advantages and features of this invention will be realized and attained by means of the elements and combinations particularly pointed out in the claims.

DETAILED DESCRIPTION

Reference will now be made in detail to preferred embodiments of the invention, examples of which are illustrated in the accompanying drawings. FIGS. 1–5 depict various aspects for protecting components of an integrated circuit from noise.

Figure 1:
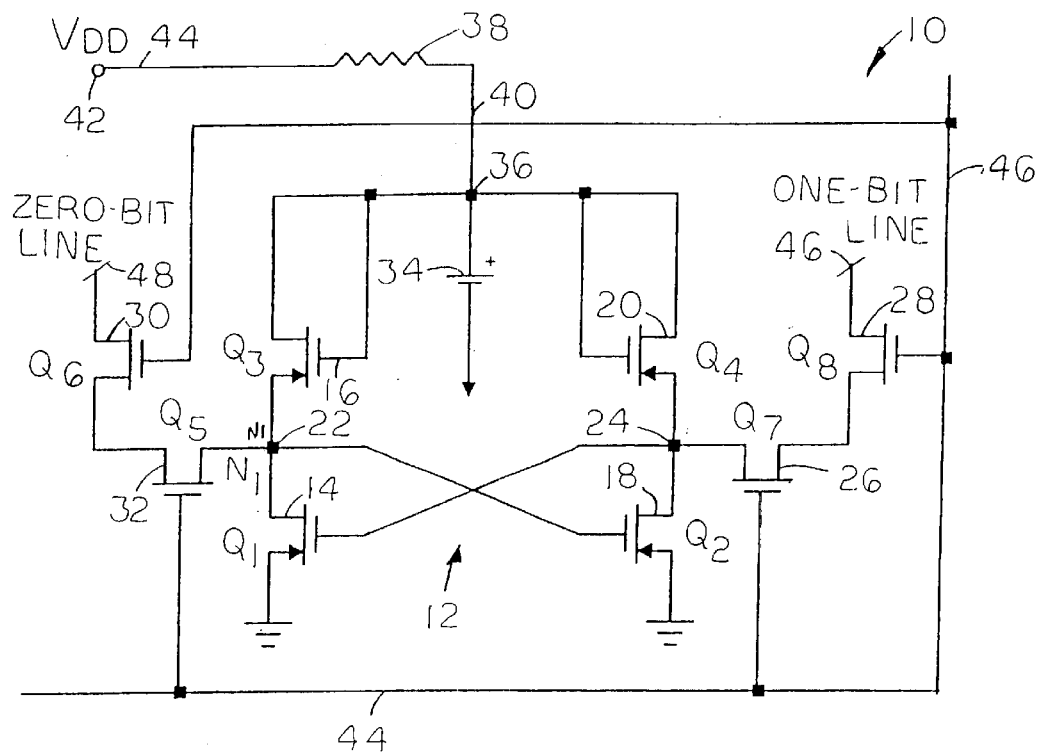
FIG. 1 is a schematic diagram of an integrated circuit including inverters, a micro-battery and a resistor for reducing switching noise in an integrated circuit in accordance with a first embodiment of this invention.

FIG. 1 shows a schematic diagram of a single MOS-RAM cell 10 for use in a mixed-mode integrated circuit having an inverter circuit 12 including cross-coupled transistors 14, 16, 18 and 20 joined at nodes 22, 24, a gating network of transistors 26, 28, 30 and 32 coupled to the inverter circuit 12. A micro-battery 34 is coupled to the inverter circuit 12 at a node 36. A resistor 38 is coupled to the micro-battery 34 at one end 40 and connected to a power source 42, i.e. $V_{DD}$, at the other end 44. For illustrative purposes, FIG. 1 shows a single cell 10 however, this invention is not limited to a single cell 10. The inverter circuit 12 may be used to read and write binary information in the cell 10.

The transistors 26, 28 forming a first gating network are coupled to a one-bit line 46. The transistors 30, 32 forming a second gating network are coupled to a zero-bit line 48. The bit lines 46, 48 provide a manner for determining the state of the storage cell by detecting if the one-bit line 46 or the zero-bit line 48 has current flowing to it.

Address lines 44, 46 are utilized for reading and writing to storage cells of the inverter circuit 12. To perform a read or write operation, the address lines 44, 46 are excited by a clock pulse (not shown). The clock pulse normally includes a stream of square waves representing voltages such as, for instance, a high value of zero volts and a low value of −10 volts (or −$V_{DD}$).

In a quiescent state, both address lines 44, 46 are at ground potential. In this state, one transistor 18 is on and one transistor 14 is off For instance, if transistor 18 is one and transistor 14 off, then the voltage at the node 24 is low, for instance −$V_{DD}$ and the voltage at node 22 is high, for instance zero. To read data in the cell, address lines 44, 46 are pulsed with a clock pulse. Current flows to the one-bit line 46 which is low (i.e. −$V_{DD}$) and through gating devices 26 and 28 and the on transistor 18. Little current flows through the zero-bit line 48 which is also at a low voltage (i.e. −$V_{DD}$) since transistor 14 is off.

To write data in the cell, the address lines 44, 46 are again pulsed with a clock pulse and the one-bit line 46 is grounded. Grounding the zero-bit line 48 pulls the node 22 to ground to turn off transistor 18 and turn on transistor 14 as the inverter circuit 12 transitions from one logic state to another logic state.

However, as the inverter circuit 12 transitions from one logic state to another logic state, for a short period of time, both transistor 18 and transistor 14 are on. During this transition period, a high amount of current surges through the system 10. This current surge triggers a corresponding spike in voltage. If uncontrolled, this voltage spike causes noise to traverse to a number of components, for example, analog components, power bus, integrated circuit structure, power line or silicon substrate. A current is needed to reduce the voltage spike.

At steady state, the micro-battery 34 is uncharged. However, when the inverter circuit 12 changes logic state, i.e. flips, and the current surge occurs, the resultant peak voltage is absorbed by the micro-battery 34 instead of flowing to and disrupting the components, including the analog components. The micro-battery 34 charges gradually so no voltage spike occurs. When current is needed to reduce the high voltage, it is drawn from the micro-battery 34 and the transistors and other components are isolated from the power line 44, i.e. from source $V_{DD}$, by the resistor 38 that limits the current drawn on the line 44. The resistor 38 size can vary and is dependent upon the size of the micro-battery 34 utilized in the system 10.

A suitable micro-battery 34 for use with this invention is a thin-film battery available from Excellatron Solid State, LLP, 1640 Roswell Street, Suite J, Smyrna, Ga. Excellatron has both proprietary and licensed thin-film battery technology including the micro-battery disclosed in U.S. Pat. Nos. 5,569,520 and 5,597,660, the disclosures of which are incorporated by herein by this reference. Applicant's patent application Ser. No. 09/286,112, entitled, "Thin Lithium Film Battery," filed Apr. 2, 1999 and patent application Ser. No. 09/543,121, entitled, "Method of Producing a Thin Film Battery," filed Apr. 5, 2000, patent application Ser. No. 09/536,594, entitled, "Method of Producing a Thin Film Battery," filed Mar. 28, 2000, patent application Ser. No. 09/543,280, entitled, "Method of Producing a Thin Film Battery Anode," filed Apr. 5, 2000, and patent application Ser. No. 09/536,535, entitled, "Method of Producing a Thin Film Battery Having a Protective Packaging," filed Mar. 28, 2000 are incorporated by this reference herein. Generally, the thin film battery encompasses a stacked configuration of films commencing with an inert ceramic or aluminum substrate upon which a cathode current collector and cathode is mounted. A solid state electrolyte is deposited upon the cathode, an anode in turn deposited upon the electrolyte, and an anode current collector is mounted upon the anode. Typically, a protective coating is applied over the entire cell. Preferably, the thin film battery is rechargeable.

Figure 2:
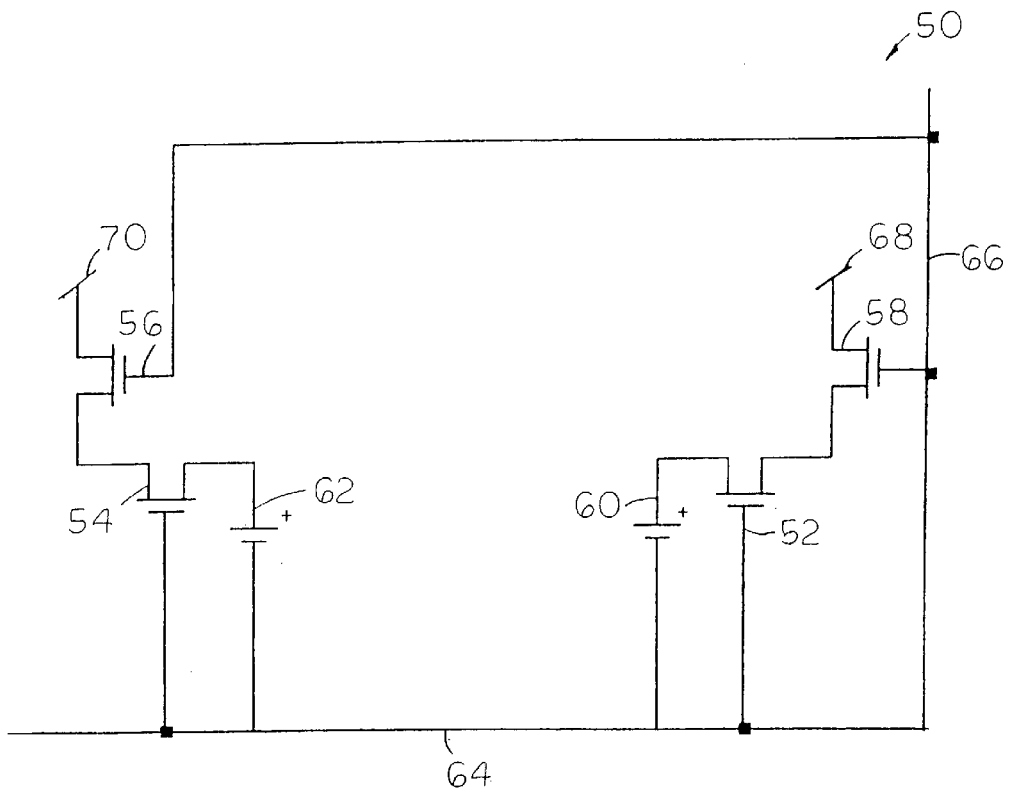
FIG. 2 is a schematic diagram of an integrated circuit including bipolar transistors and micro-batteries for reducing noise in accordance with a second embodiment of this invention.

FIG. 2 shows a schematic diagram 50 of bipolar transistors 52, 54, gating devices 56 and 58, micro-batteries 60, 62, and address lines 64, 66 in accordance with a second embodiment of this invention. The gating devices 56, 58, include bipolar transistors that are each coupled to a bit line 68, 70. Gating device 58 couples to a one-bit line 68 and gating device 56 couples to a zero-bit line 70.

In an initial state, one bipolar transistor 52 is on and the other bipolar transistor 54 is off. The state of the transistors 52, 54 can be determined by examining which micro-battery 60, 62 is charged. In a charged state, the one-bit line 68 is low such that transistor 52 is on. To change the logic state of the transistors 52, 54 the address lines 64, 66 are pulsed with a clock pulse (not shown) from low to high, i.e. from −$V_{DD}$ to zero. Charging the micro-battery 60, 62 enables a write to transistors 52, 54 and a transition in logic state of transistors 52, 54. During the transition, the micro-batteries 60. 62 provide current when demanded to eliminate a voltage spike that can cause system noise.

Figure 3:
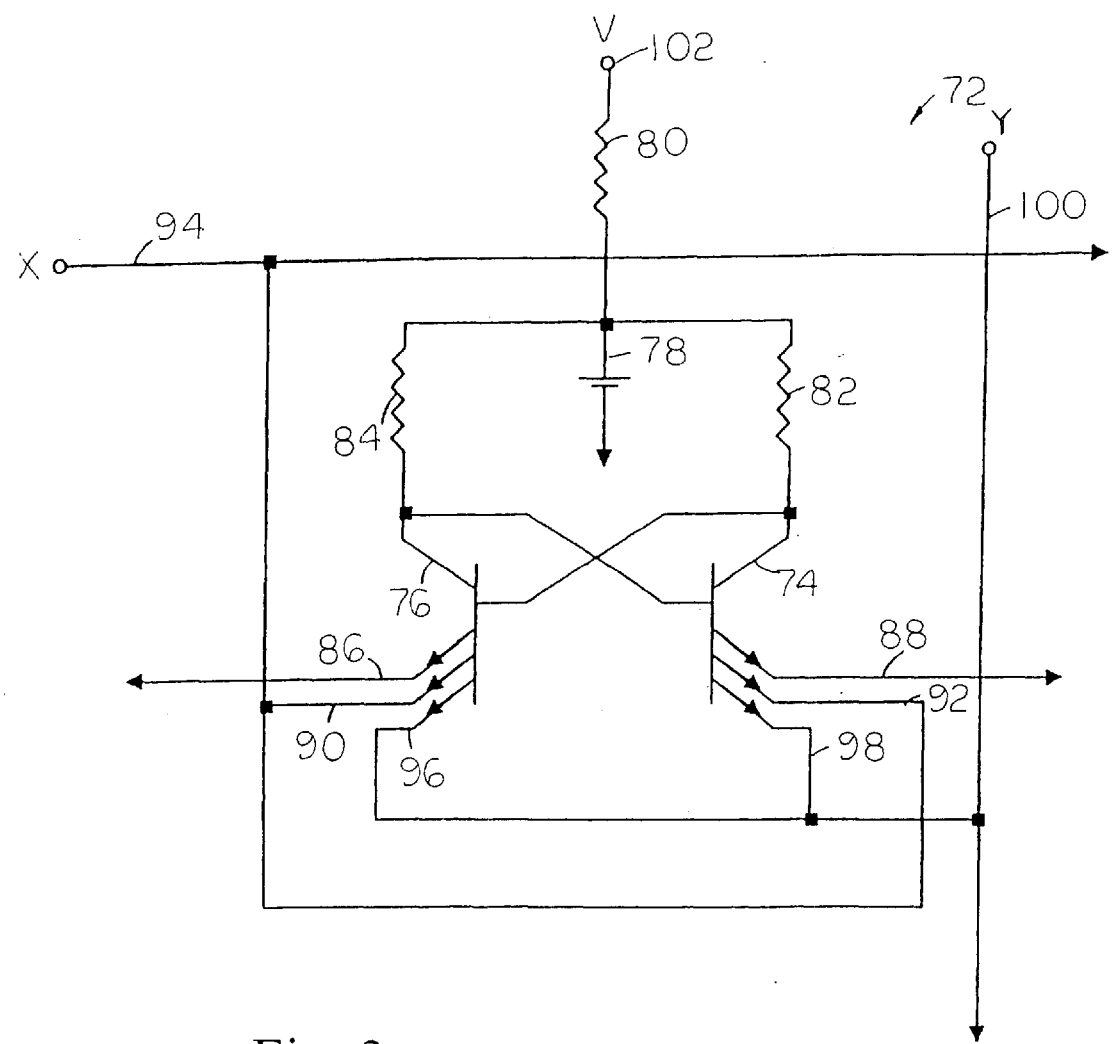
FIG. 3 is a schematic diagram of a bipolar RAM storage cell including two crosscoupled three-emitter transistors, a micro-battery and resistors for reducing switching noise in accordance with a third embodiment of this invention.

FIG. 3 shows a schematic diagram of a bipolar RAM storage cell 72 including two cross-coupled three-emitter transistors 74, 76, a micro-battery 78 and resistors 80, 82 and 84 for reducing switching noise. One emitter 86 of transistor 74 serves to sense or write a logic one when transistor 74 is conducting. One emitter 88 of transistor 76 serves to read or wrote a logic zero when transistor 76 is conducting. Emitter 90 of transistor 76 and emitter 92 of transistor 74 connect to address line X 94. Emitter 96 of transistor 76 and emitter 98 of transistor 74 connect to address line Y 100. Typically, the address lines 94, 100 are held low, i.e. logic 0, and currents from all conducting transistors flow out of these address lines 94, 100.

If the bipolar RAM storage cell 72 is one of a number of cells in a matrix array, to address an individual cell 72, address lines 94, 100 transistor to a logic 1. The remaining cells in the matrix array that are not being addressed have at least one of their respective address lines at logic 0 so that no change occurs in those cells. In cell 72, the current from the conducting transistor diverts from the address lines to the read line and subsequently to one of the read amplifiers (not shown).

To write to cell 72, cell 72 is addressed as described above. A logic 1 applied to the write emitter input 86, causes the output of the transmitter 74 to drop to a logic 0. A logic 0 voltage on the output of a write emitter 86 applies the same low voltage to all the emitters of the cell 72. If the cell 72 is in the desired state, no change occurs. If the cell 72 is not in the desired state, the low voltage applied to the emitter 86 of the transistor 76, which is off, causes transistor 76 to turn on and causing the enable transistor 74 to turn off.

When transistor 76 turns on and transistor 74 turns off, for a period of time both transistors 74, 76 will be on. During this period, a high current exists causing a voltage surge. To avoid this surge causing noise to propagate the system, a micro-battery 78 has been added to the network. The micro-battery 78 performs like a capacitor and supplies transition current. Thus, when the voltage surges and current is needed to draw down the voltage, the current is drawn from the micro-battery 78. The resistor 80 isolates the voltage line 102 from other components and limits the amount of current drawn from the line 102. Once discharged the micro-battery 78 gradually recharges so there is no voltage spike.

Figure 4:
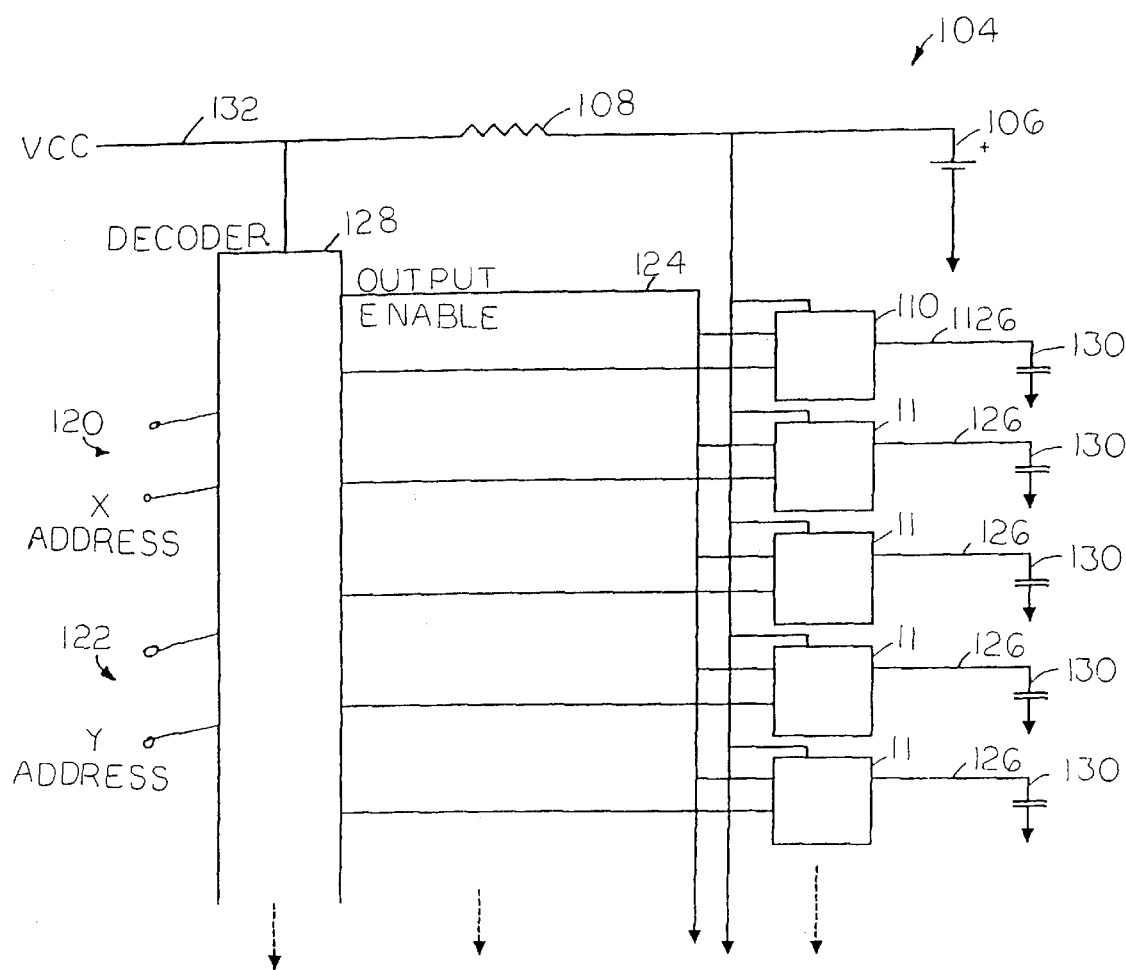
FIG. 4 is a schematic diagram of a random access memory network having a plurality of cells and a micro-battery and resistor for reducing switching noise in accordance with a forth embodiment of this invention.

FIG. 4 shows a schematic diagram of a random access memory network 104 having a micro-battery 106 and resistor 108 for reducing switching noise. The random access memory network 104 includes a plurality cells 110, 112, 114, 116, and 118 (five cells shown for illustrative purposes only). The cells 110, 112, 114, 116 and 118 encompasses an inverter circuit, such as the inverter circuits shown in FIGS. 1 and 3 or the transistor configuration shown in FIG. 2.

Each cell 110, 112, 114, 116 and 118 has input/output leads for X-Y addressing 120, 122 and for read/write functions 124, 126. The read lines 124 once enabled detect digital information stored in each cell: 110, 112, 114, 116, and 118. The write lines 126 place digital information to be stored in a selected cell. A decoder 128 deciphers the addressing information and selects the individual addressed cell selected to receive a read or write transaction. Each cell 110, 112, 114, 116 and 118 includes a capacitor 130, for instance a 125 microfarads capacitor, that serves to draw some current from the cell 110, 112, 114, 116, 118 upon transition from an on/off logic state or vice versa; i.e. read/write or write/read. However, the capacitor 130 stores current until fully charged. However, since the capacitor 130 cannot charge instantaneously, during transitions in logic states when a large amount of current exists, the capacitor slowly charges maintaining zero voltage until it charges and thus, cannot handle a large current surge. During this period a high current exists. Thus, current surges through the network 104. While the capacitor 130 is charging and high current exists in the network 104, a voltage spike can flow on to the power line 132.

Therefore, as shown in FIG. 4, to solve the inability of the capacitor 130 to handle large current surges, the micro-battery 106 and resistor 108 are added to the network. During the period when the cells 110, 112, 114, 116, 118 transition from one logic state to another, for a period of time, more than one inverter is on. Due to the addition of the micro-battery 106, the capacitor 130 charges from the micro-battery 106 instead of being uncharged allowing the capacitor 130 to be ready to handle the current surge that occurs during the transition period. The resistor 108 serves to further limit the current draw on the voltage line 132.

Figure 5:
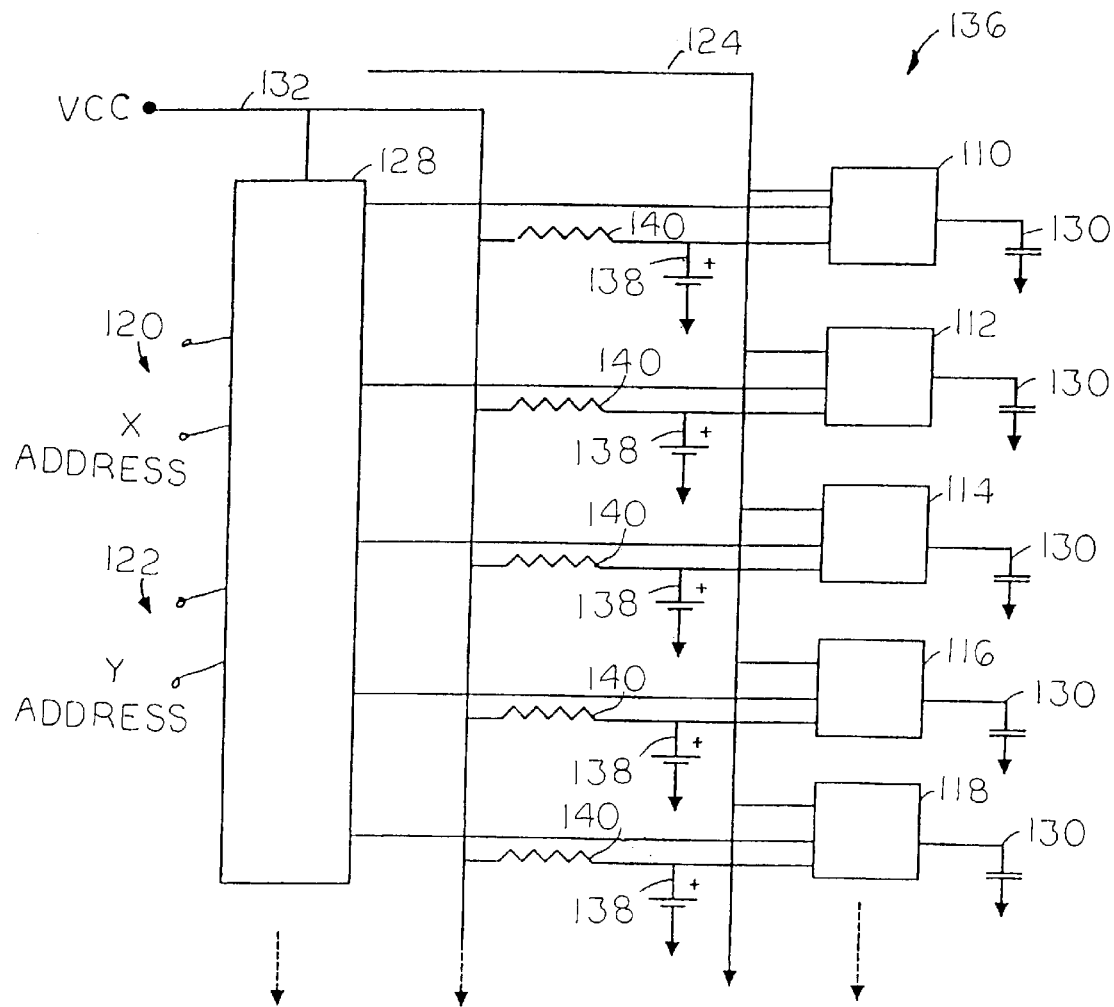
FIG. 5 is a schematic diagram of a random access memory network having a plurality of cells with a micro-battery and a resistor associated with each cell of the network for reducing switching noise in accordance with a fifth embodiment of this invention.

FIG. 5 shows a schematic diagram of a random access memory network 136 with a micro-battery 138 and resistor 140 circuit associated with each cell 110, 112, 114, 116, and 118 of the network 136. While the embodiment shown in FIG. 4 reduces switching noise, the speed of the network 104 of FIG. 4 is limited by how fast each capacitor 130 charges. However, if the capacitor charges more quickly, more noise is introduced in the network 104. The network shown in FIG. 5 achieves increased speed and reduced noise because of the localized micro-battery 138 source for each cell 110, 112, 114, 116 and 118. Further, the configuration of FIG. 5 allows a reduction in resistor 140 size.

Thus, the random access memory network 136 includes a micro-battery 138 for each cell 110, 112, 114, 116 and 118 that operates independently. The micro-battery 138 is typically smaller than the micro-battery 106 of FIG. 4. The micro-battery 138 provides local energy to charge the capacitor 130, which increases the speed of the network 136. By placing the capacitor 130 closer to the power source, i.e. the micro-battery 138, the capacitor 130 charges faster because the time it takes to charge the capacitor is related to the resistance between the capacitor and power source. In addition, if the capacitor 130 is brought closer to the power source, i.e. the micro-battery 138, then the resistor 140 size can be reduced thereby increasing the overall speed of the network 136.

As the cells 110, 112, 114, 116, and 118 transition from one logic state to another logic state, for a period of time more than one cell 110, 112, 114, 116, and 118 is turned on. During this period, high current exists causing a voltage spike and resultant introduction of noise to the network 136. The embodiment shown in FIG. 5 eliminates this noise by use of the micro-battery 138 coupled to each cell 110, 112, 114, 116 and 118. When high current is needed in the transition state, the current demand is fulfilled by the micro-battery 138. High current and subsequent voltage spikes are isolated from the power line 132 by use of the resistor 140 that limits the amount of current drawn. Thus, the network 136 of FIG. 5 provides for both increased speed while reducing or eliminating switching noise.

An advantage of this invention is that the addition of a micro-battery to an integrated circuit significantly reduces switching noise that arises when switching between logic states generating high currents that cause large voltage spikes. The micro-battery supplies the current required to dissipate the voltage spikes.

Another advantage of this invention is that the micro-battery allows for the operation of high-speed random access memory integrated circuits having a plurality of memory cells without introducing additional noise. By using a localized micro-battery either alone or in combination with a resistor in the integrated circuit, components can be charged at a faster rate and high speed switching can occur.

Yet advantage of this invention is that by using micro-batteries to reduce switching noise, the micro-batteries store more energy using less area on the integrated circuit so precious space on integrated circuits is not used with this solution.

Still another advantage of this invention is that it uses micro-batteries instead of capacitors. Micro-batteries typically store relatively large amounts of energy that is released slowly over a long period of time while capacitors store relatively large amounts of energy that is available in short bursts and thus batteries can slowly release stored currents.

The foregoing is provided for purposes of illustrating, explaining and describing several embodiments of this invention. Modifications and adaptations to these embodiments will be apparent to those of ordinary skill in the art and may be made without departing from the scope or spirit of the invention and the following claims. For instance, micro-batteries and/or associated resistors can be used to reduce noise in any semi-conductor device having high current demands that result in voltage spikes and subsequent transient noise. Also, the embodiments described in this document in no way limit the scope of the below claims as persons skilled in this art recognize that this invention can be easily modified for use to provide additional functionalities and for new applications.

I claim:

1. A system for reducing noise in a mixed-mode integrated circuit, comprising:

a first transistor network in a first logic state;

a second transistor network in a second logic state; and a micro-battery coupled to both the first transistor network and the second transistor network wherein during a transition of logic states by the first and second transistors and current surges during the period when both the first and second transition network are turned on causing a spike in voltage, current demand is met by the micro-battery that gradually recharges eliminating voltage spikes traversing through the mixed-mode integrated circuit.

2. The system of claim 1, further comprising:
a first gating network coupled to the first transistor network;
a second gating network coupled to the second transistor network; and
address lines coupled to the first and second gating networks for activating read and write operations thereby enabling the transition of the logic states of the first and second transistor networks.

3. The system of claim 2, further comprising a resistor coupled at one end to the micro-battery and to a voltage source at the other end, the resistor adapted to isolate the voltage source from the voltage spikes and to limit the amount of current drawn.

4. The system of claim 1, wherein the first and second transistor networks comprise a MOSFET random access memory cell.

5. The system of claim 2, wherein the micro-battery further comprises a thin film battery.

6. The system of claim 5, wherein the thin film battery further comprises an aluminum cathode collector, a crystallized lithium intercalation compound cathode deposited upon the aluminum cathode collector having a cobalt coating, an anode, an electrolyte disposed between the lithium intercalation compound cathode and the anode and an anode collector coupled to the anode.

7. The system of claim 5, wherein the thin film battery further comprises a battery cell substructure having a lithium based cathode, an electrolyte and a metallic anode current collector capable of alloying with lithium.

8. A method for reducing switching noise of a semiconductor integrated circuit having analog and digital components on the same substrate including a cross-coupled flip-flop circuit including at least two group of transistors in a quiescent state with a first group of transistors in a first logic state and a second group of transistors in a second logic state, comprising:
pulsing address lines coupled to each group of transistors with clock pulses which turns on gating devices and flows voltage to a one bit line such that a cell of the integrated circuit can be read;
charging a micro-battery coupled at one end to the group of transistors;
transitioning the first group of transistors from the first logic state to the second logic state by pulsing the address lines and grounding the one bit line associated with a second group of transistors, causing a zero bit line to transition from a low logic state to ground thereby turning on the second group of transistors and turning off the first group of transistors by pulling the first group of transistors to ground;
during the period when both the first group of transistors and the second group of transistors are turned on and a high current exists causing a voltage spike pulling current from the charged micro-battery; and
limiting current flow by use of a resistor coupled at one end to one end of the battery and to the voltage source at another end of the resistor.

9. A system for reducing noise in a mixed-mode integrated circuit, comprising:
a first transistor network in a first logic state;
a second transistor network in a second logic state;
a thin film battery coupled to both the first transistor network and the second transistor network;
a first gating network coupled to the first transistor network;
a second gating network coupled to the second transistor network;
address lines coupled to the first and second gating networks for activating read and write operations thereby enabling the transition of the logic states of the first and second transistor networks; and
a resistor coupled at one end to the thin film battery and to a voltage source at the other end, the resistor adapted to isolate the voltage source and limit the current drawn from the thin film battery wherein during a transition of logic states by the first and second transistors and current surges during the period when both the first and second transition network are turned on causing a spike in voltage, current demand is met by the thin film battery that gradually recharges eliminating voltage spikes traversing the mixed-mode integrated circuit.

10. The system of claim 9, wherein the thin film battery further comprises an aluminum cathode collector, a crystallized lithium intercalation compound cathode deposited upon the aluminum cathode collector having a cobalt coating, an anode, an electrolyte disposed between the lithium intercalation compound cathode and the anode and an anode collector coupled to the anode.

11. The system of claim 9, wherein the thin film battery further comprises a battery cell substructure having a lithium based cathode, an electrolyte and a metallic anode current collector capable of alloying with lithium.

12. A system for reducing noise in a mixed-mode integrated circuit, the integrated circuit including at least one inverter having at least one logic state, the system comprising:
a current source emitting from the inverter that surges during a transition in logic state;
a micro-battery coupled to the inverter and adapted to absorb the current source; and
a resistor coupled to the micro-battery and a power source for limiting the current drawn from the micro-battery.

* * * * *